US012812777B2

(12) United States Patent
Kim et al.

(10) Patent No.: US 12,812,777 B2
(45) Date of Patent: Nov. 24, 2026

(54) PRINTED CIRCUIT BOARD

(71) Applicant: SAMSUNG ELECTRO-MECHANICS CO., LTD., Suwon-si (KR)

(72) Inventors: Man Gon Kim, Suwon-si (KR); Heui Un Jang, Suwon-si (KR); Jin Young Heo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 344 days.

(21) Appl. No.: 18/736,995

(22) Filed: Jun. 7, 2024

(65) Prior Publication Data

US 2025/0126710 A1 Apr. 17, 2025

(30) Foreign Application Priority Data

Oct. 17, 2023 (KR) ........................ 10-2023-0138399

(51) Int. Cl.
*H05K 1/11* (2006.01)

(52) U.S. Cl.
CPC ... *H05K 1/113* (2013.01); *H05K 2201/09227* (2013.01); *H05K 2201/094* (2013.01); *H05K 2201/09545* (2013.01); *H05K 2201/0959* (2013.01); *H05K 2201/09727* (2013.01)

(58) Field of Classification Search
CPC ...... H05K 1/113; H05K 1/111; H05K 3/4655; H05K 1/0313; H05K 1/09; H05K 3/4602; H05K 1/115; H05K 2201/09545; H05K 2201/094; H05K 2201/0959; H05K 2201/09727
USPC ......................... 174/250, 261, 251, 255, 260
See application file for complete search history.

(56) References Cited

U.S. PATENT DOCUMENTS

| | | | | | |
|---|---|---|---|---|---|
| 6,407,345 | B1 | 6/2002 | Hirose et al. | | |
| 8,654,538 | B2 * | 2/2014 | Kariya | H05K 1/0298 | 361/764 |
| 8,893,380 | B2 * | 11/2014 | Kim | H05K 1/185 | 29/841 |
| 11,019,719 | B2 * | 5/2021 | Matsumoto | H05K 1/025 | |
| 11,641,715 | B2 * | 5/2023 | Kim | H05K 1/113 | 174/250 |

(Continued)

FOREIGN PATENT DOCUMENTS

| | | | |
|---|---|---|---|
| KR | 10-2004-0019863 | A | 3/2004 |
| KR | 10-0791281 | B1 | 1/2008 |
| KR | 10-2297345 | B1 | 9/2021 |

*Primary Examiner* — Angel R Estrada
(74) *Attorney, Agent, or Firm* — Morgan, Lewis & Bockius LLP

(57) ABSTRACT

A printed circuit board includes a core layer, a plurality of first wirings disposed on the core layer, a first pad disposed on the core layer, the first pad including an adjacent portion having a side disposed to be substantially parallel to a side of an adjacent first wiring of the plurality of first wirings, and an open portion disposed to not be parallel to the adjacent wiring, among the plurality of first wirings, and a first build-up insulating layer disposed on the core layer, the first build-up insulating layer covering at least a portion of the plurality of first wirings and the first pad. The core layer includes an insulating material, substantially different from that of the first build-up insulating layer.

21 Claims, 10 Drawing Sheets

(56) References Cited

U.S. PATENT DOCUMENTS 11,792,916 B2 * 10/2023 Park ........................ H05K 3/465
174/255
11,910,527 B2 * 2/2024 Kim ......................... H05K 1/03

* cited by examiner

PRINTED CIRCUIT BOARD

CROSS-REFERENCE TO RELATED APPLICATION(S)

This application claims the benefit of priority to Korean Patent Application No. 10-2023-0138399 filed on Oct. 17, 2023 in the Korean Intellectual Property Office, the disclosure of which is incorporated herein by reference in its entirety.

TECHNICAL FIELD

The present disclosure relates to a printed circuit board.

BACKGROUND

Multichip packages including a memory chip such as a high bandwidth memory (HBM) and a processor chip such as a central processing unit (CPU), a graphics processing unit (GPU), an application specific integrated circuit (ASIC), a field programmable gate array (FPGA), or the like have been used to process data, which has been exponentially increasing due to recent developments in artificial intelligence (AI) technology. In particular, the number of CPU and GPU cores in server products has rapidly increased, and the number of layers of multilayer boards has been increasing to process the increased CPU and GPU cores. Accordingly, continuous efforts have been conducted to improve reliability while reducing the number of layers of boards and enabling interlayer connections between fine-pitch patterns and pads.

SUMMARY

An aspect of the present disclosure provides a printed circuit board including a pattern and a pad having a fine pitch.

Another aspect of the present disclosure provides a printed circuit board capable of preventing defects in a pattern and a pad from occurring even when a low-cost construction method is used.

Another aspect of the present disclosure provides a printed circuit board having improved reliability.

According to an aspect of the present disclosure, there is provided a printed circuit board including a core layer, a plurality of first wirings disposed on the core layer, a first pad disposed on the core layer, the first pad including an adjacent portion having a side disposed to be substantially parallel to an adjacent first wiring of the plurality of first wirings, and an open portion disposed to not be parallel to the adjacent wiring, among the plurality of first wirings, and a first build-up insulating layer disposed on the core layer, the first build-up insulating layer covering at least a portion of the plurality of first wirings and the first pad. The core layer may include an insulating material, substantially different from that of the first build-up insulating layer.

According to an aspect of the present disclosure, there is provided a printed circuit board including a first insulating layer, a plurality of first wirings respectively disposed on upper and lower surfaces of the first insulating layer, and a first pad disposed on each of the upper and lower surfaces of the first insulating layer, the first pad including an adjacent portion having a side disposed to be substantially parallel to a side of an adjacent first wiring of the plurality of first wirings, and an open portion disposed to not be parallel to the adjacent first wiring. A distance between the adjacent portion of the first pad and the adjacent first wiring adjacent to the first pad may be substantially equal to a distance between the adjacent first wiring adjacent to the first wiring and first wirings adjacent the first adjacent first wiring.

According to example embodiments of the present disclosure, a printed circuit board may include a pattern and a pad having a fine pitch.

The printed circuit board may prevent defects in a pattern and a pad from occurring even when a low-cost construction method is used.

The printed circuit board may have improved reliability.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
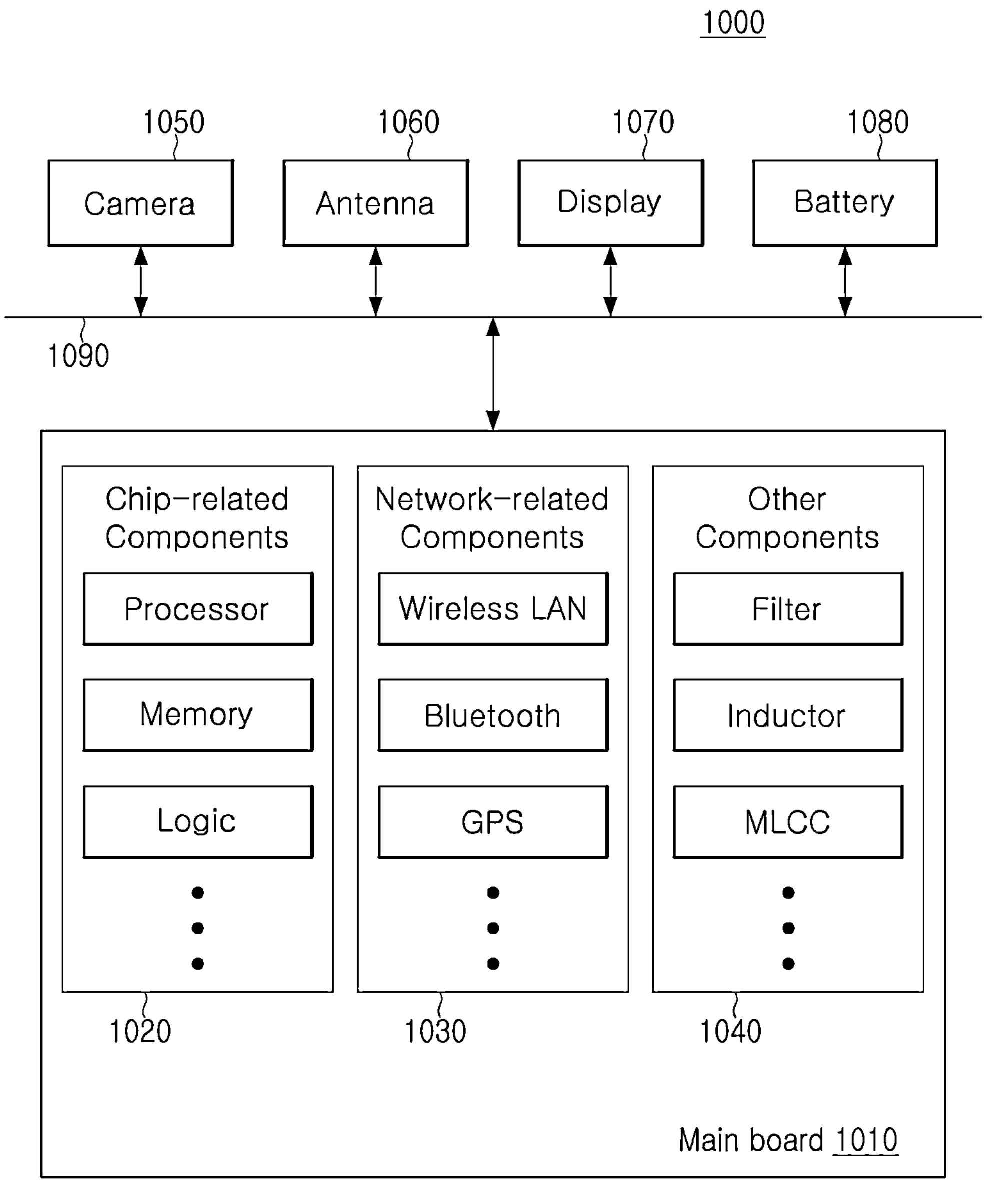
FIG. 1 is a schematic block diagram of an example of an electronic device system.

Hereinafter, the present disclosure will be described with reference to the accompanying drawings. The shapes and sizes of components in the drawings may be exaggerated or reduced for clearer description.

Electronic Device

FIG. 1 is a schematic block diagram of an example of an electronic device system.

Referring to FIG. 1, an electronic device 1000 may accommodate a mainboard 1010. The mainboard 1010 may include chip-related components 1020, network-related components 1030, and other components 1040, physically or electrically connected thereto. Such components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), or a flash memory, an application processor chip such as a central processor (for example, a central processing unit (CPU)), a graphics processor (for example, a graphics processing unit (GPU)), a digital signal processor, a cryptographic processor, a microprocessor, or a microcontroller, and a logic chip such as an m analog-to-digital converter or an application-specific integrated circuit (ASIC). However, the chip-related components 1020 are not limited thereto, and may include other types of chip-related components. In addition, the chip-related components 1020 may be combined with each other. The chip-related components 1020 may be in the form of a package including the above-described chip or electronic component.

The network-related components 1030 may include protocols such as wireless fidelity (Wi-Fi) (Institute of Electrical And Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the above-described protocols. However, the network-related components 1030 are not limited thereto, and may also include a variety of other wireless or wired standards or protocols. In addition, the network-related components 1030 may be combined with each other, together with the chip-related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, and may also include passive components used for various other purposes, or the like. In addition, the other components 1040 may be combined with each other, together with the chip-related components 1020 or the network-related components 1030 described above.

Depending on a type of the electronic device 1000, the electronic device 1000 may include other components that may be or may not be physically or electrically connected to the mainboard 1010. The other components may include, for example, a camera module 1050, an antenna module 1060, a display 1070, a battery 1080, and the like. However, the other components are limited thereto, and may be an audio codec, a video codec, a power amplifier, a compass, an accelerometer, a gyroscope, a speaker, a mass storage unit (for example, a hard disk drive), a compact disk (CD), a digital versatile disk (DVD), or the like. In addition, the other components may also include other components used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device to process data.

Figure 2:
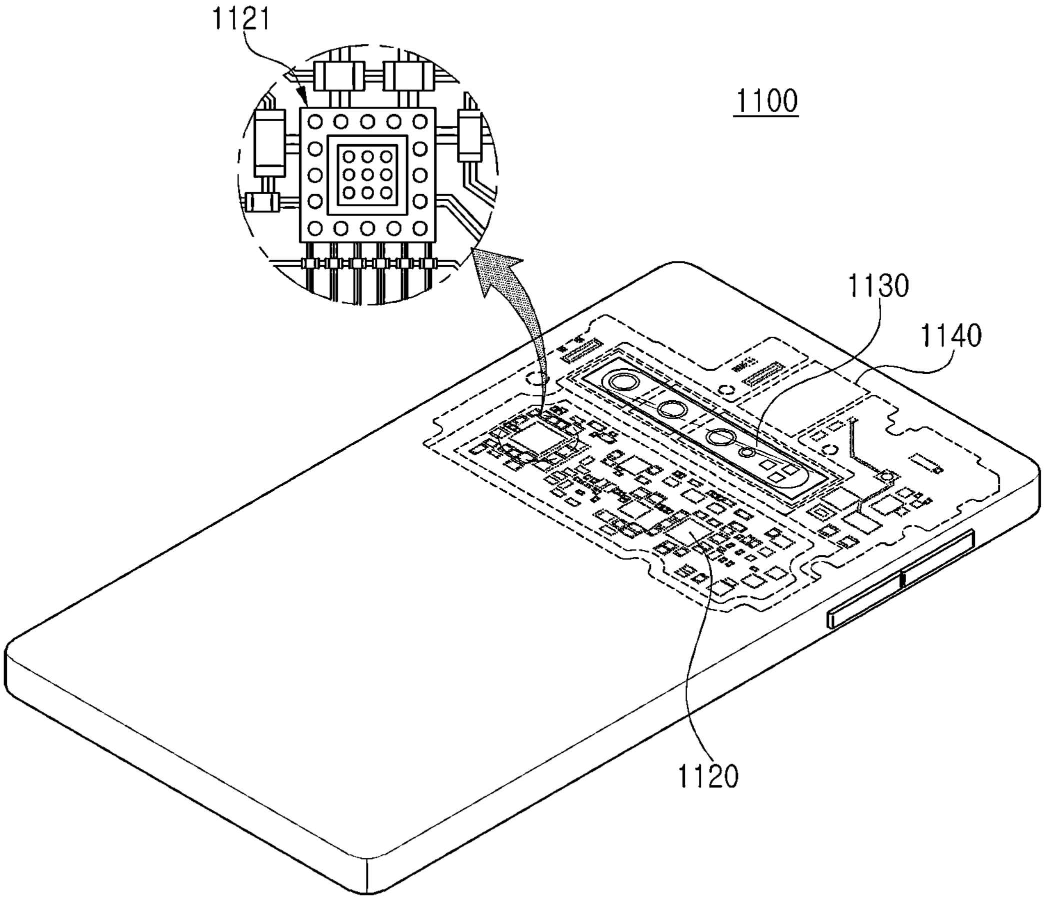
FIG. 2 is a schematic perspective view of an example of an electronic device.

FIG. 2 is a schematic perspective view of an example of an electronic device.

Referring to FIG. 2, an electronic device may be, for example, a smartphone 1100. The motherboard 1110 may be accommodated in the smartphone 1100, and various electronic components 1120 may be physically and/or electrically connected to the motherboard 1110. In addition, other electronic components that may be or may not be physically and/or electrically connected to the motherboard 1110 may be accommodated therein, such as a camera module 1130 and/or a speaker 1140. A portion of the electronic components 1120 may be the chip-related components described above, for example, a component package 1121, but the present disclosure is not limited thereto. The component package 1121 may be in the form of a printed circuit board on which electronic components including active components and/or passive components are surface-mounted. The electronic device is not necessarily limited to the smartphone 1100, and may be other electronic devices, as described above.

Printed Circuit Board

Figure 3:
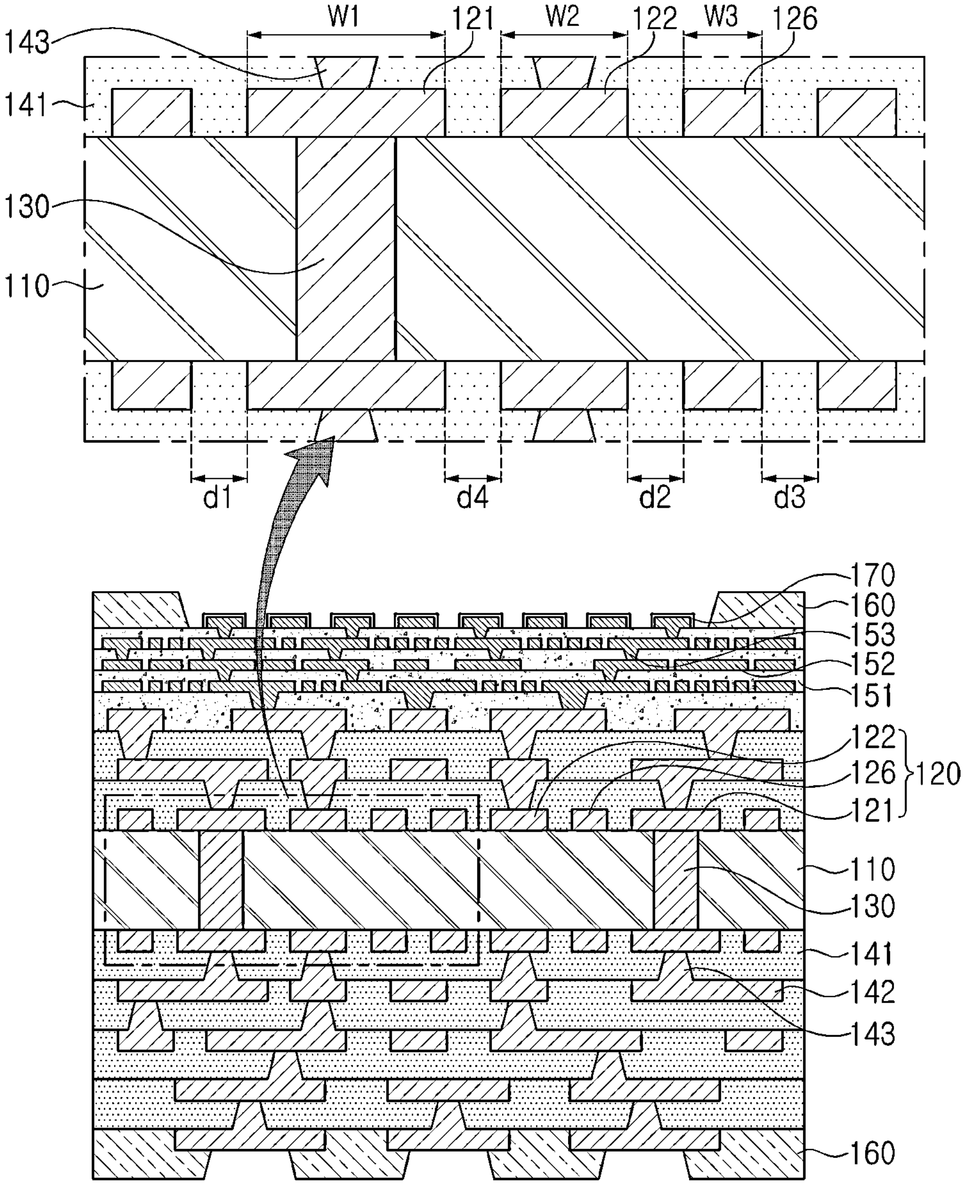
FIG. 3 is a schematic cross-sectional view of a printed circuit board according to an example.

FIG. 3 is a schematic cross-sectional view of a printed circuit board according to an example.

Referring to FIG. 3, the printed circuit board according to an example may include a core layer 110, a first wiring layer 120 disposed on the core layer 110, and a through-via 130 passing through the core layer 110 to connect first wiring layers 120 disposed on opposing surfaces of the core layer 110 to each other. The first wiring layer 120 may include a first wiring 126, a first pad 121, a second pad 122, and a first pattern.

The core insulating layer 110 may include an insulating material. The insulating material may include a thermosetting resin such as an epoxy resin, a thermoplastic resin such as polyimide, or a resin in which the thermosetting resin or the thermoplastic resin is impregnated in a material mixed with an inorganic filler such as silica, or a core material such as a glass fiber (or glass cloth or glass fabric), together with the inorganic filler, for example, an organic insulating material such as a prepreg or the like, but the present disclosure is not limited thereto. The core layer 110 may be CCL in which a copper foil is laminated on an upper side and lower side of a resin impregnated with a core material such as a glass fiber, but the present disclosure is not limited thereto. The core layer 110 may include other insulating materials than the organic insulating material, such as a glass plate or the like, as necessary.

The first wiring layer 120 may include a metal. The metal may include copper (Cu), aluminum (Al), silver (Ag), tin (Sn), gold (Au), nickel (Ni), lead (Pb), titanium (Ti), and/or alloys thereof. The metal may preferably include copper (Cu), but the present disclosure is not limited thereto. The first wiring layer 120 may perform various functions depending on a design thereof. For example, a signal pattern, a power pattern, a ground pattern, and the like may be included, but the present disclosure is not limited thereto. Each of the above-described patterns may have various forms such as a line, a plane, a pad, and the like.

The first wiring layer 120 may include an electroless plating layer (or chemical copper) and an electrolytic plating layer (or electrolytic copper). Alternatively, the first wiring layer 120 may include a metal foil (or copper foil) and an electrolytic plating layer (or electrolytic copper). Alternatively, the first wiring layer 120 may include a metal foil (or copper foil), an electroless plating layer (or chemical copper), and an electrolytic plating layer (or electrolytic copper). A sputtering layer may be included instead of the electroless plating layer (or chemical copper), and both may be included, as necessary. As the core layer 110 may be CCL in which a copper foil is formed on an upper side and lower side of a resin, each component of the first wiring layer 120 may be formed of a single layer of copper, and electroplating may be performed thereon in the form of a panel using a copper foil as a seed. The first wiring layer 120 may be formed using any method of patterning a circuit layer on a printed circuit board. However, the printed circuit board according to an example may be formed using one of a subtractive method or tenting method, when the core layer 110 is CCL, but present disclosure is not limited thereto. The subtractive method or tenting method may be performed on a wide metal plate or copper foil that is in the form of a panel by marking a necessary portion and then removing an unnecessary portion. In this case, a physical method or a chemical method may be used to remove a copper foil. As a non-limiting example, chemical etching may be used.

The through-via 130 may include a metal. The metal may include copper (Cu), aluminum (Al), silver (Ag), tin (Sn), gold (Au), nickel (Ni), lead (Pb), titanium (Ti), and/or alloys thereof. The metal may preferably include copper (Cu), but the present disclosure is not limited thereto. A through-via may be conformally formed by plating the above-described metal material on a wall of a through-hole passing through the core layer 110, and may have a plated through-hole (PTH) filled with an insulating material, but the present inventive concept is limited thereto. The through-via 130 may perform various functions depending on a design thereof. For example, a ground via, a power via, a signal via, and the like may be included. The through-via 130 may include an electroless plating layer (or chemical copper) and an electrolytic plating layer (or electrical copper), but the present disclosure is not limited thereto. A sputtering layer may be formed instead of the electroless plating layer, and both may be included.

The first wiring layer 120 may include a first wiring 126, a first pad 121, and a second pad 122, but may also include various patterns. The first pad 121 and the second pad 122 may be connected to a via to perform interlayer connection, and the first wiring 126 may function as a signal transmission path. The first pad 121 may be connected to the through-via 130. The first wiring layer 120 may be disposed on each of upper and lower surfaces of the core layer 110, and the first wiring 126, the first pad 121, and the second pad 122 may be disposed on each of the upper and lower surfaces of the core layer 110 to protrude from the upper and lower surfaces of the core layer 110. The first wiring layer 120 protruding from the upper and lower surfaces of the core layer 110 may mean that each component of the first wiring layer 120 is disposed to be in contact with the upper and lower surfaces of the core layer 110, and other surfaces of the first wiring layer 120 than one surface is not covered by the core layer 110. That is, the first wiring layer 120 may be disposed to protrude on opposite surfaces of the core layer 110. Such a configuration may be a result of forming the first wiring layer 120 by removing a portion of a copper foil or plating layer laminated on the opposite surfaces of the core layer 110, and may be different from a build-up wiring layer disposed in only one direction of the build-up insulating layer.

The first wiring 126 may be a linear pattern, and the first pad 121 and the second pad 122 may be a pattern having a predetermined shape. In addition, the first wiring layer 120 is not limited thereto, and may further include a first pattern 124 having a different planar shape.

The first pad 121 and the second pad 122 may respectively have a plurality of pads, and the first wiring 126 may include a plurality of wirings. The first pad 121 and the second pad 122 may respectively be connected to one of the plurality of first wirings 126.

A width W1 of the first pad 121 may be greater than a width W2 of the second pad 122. The first pad 121 may be designed to have a width greater than the width W2 of the second pad 122 and the first pad 121 may be connected to the through-via 130. Each of the first pad 121 and the second pad 122 may have a width greater than a width W3 of the first wiring 126. That is, the width W1 of the first pad 121 may be greater than the width W3 of the first wiring 126, and the width W2 of the second pad 122 may be greater than the width W3 of the first wiring 126. The first pad 121 and the second pad 122, components to be connected to a via of the first build-up via layer 143, may have a width greater than the width W3 of the first wiring 126 so as to facilitate connection to the via.

The width W1 of the first pad 121 and the width W2 of the second pad 122 may be measured by photographing a cut cross-section of the printed circuit board using a scanning microscope. The width W3 of the first wiring 126 may also be measured by photographing a cut cross-section of the printed circuit board using the scanning microscope. The width W1 of the first pad 121 and the width W2 of the second pad 122 may be measured by cutting the printed circuit board to include the first build-up via layer 143. In addition, when the first pad 121 and the second pad 122 do not have a circular shape, a width of a pad may be measured by cutting the printed circuit board in a same direction as a cutting direction for measuring a width of a wiring. The width may be calculated as an average of distances measured at five arbitrary points.

Even when the first pad 121, the second pad 122, and the first wiring 126 have different widths, a distance d1 between the first pad 121 and the first wiring 126, a second distance d2 between the pad 122 and the first wiring 126, a distance d3 between the first wirings 126 adjacent to each other, and a distance d4 between the first pad 121 and the second pad 122 may be substantially the same.

The first pad 121 and the second pad 122 may respectively include an adjacent portion disposed to be substantially parallel to an adjacent first wiring 126, among the plurality of first wirings 126, and an open portion disposed to not be substantially parallel to the adjacent first wiring 126, among the plurality of first wirings 126. The first pad 121 and the second pad 122 may respectively include the adjacent portion and the open portion, such that even when an etchant is concentrated in a region of each of the first pad 121 and the second pad 122, not adjacent to the first wiring 126, defects may not occur in the first pad 121 and the second pad 122. Detailed descriptions of the adjacent portion and the open portion, a shape of a pad, and a distance between components will be described below.

The printed circuit board according to an example may include a first build-up insulating layer 141 disposed on the core layer, the first build-up insulating layer 141 covering at least a portion of the first wiring layer 120. The first wiring layer 120 may be disposed on each of the upper and lower surfaces of the core layer 110 to protrude from the core layer 110, and at least a portion of the first wiring layer 120 may be embedded by the first build-up insulating layer 141.

In addition, the printed circuit board according to an example may include a first build-up wiring layer 142 disposed on the first build-up insulating layer 141, and a first build-up via layer 143 passing through at least a portion of the first build-up insulating layer 141 to connect the first build-up wiring layers 142 to each other or to connect the first build-up wiring layer 142 and the first wiring layer 120 to each other.

The printed circuit board according to an example may further include a second build-up insulating layer 151 disposed on the first build-up insulating layer 141, a second build-up wiring layer 152 disposed on the second build-up insulating layer 151, and a second build-up via layer 153 passing through at least a portion of the second build-up insulating layer 151 to connect the second build-up wiring layers 152 to each other or to connect the second build-up wiring layer 152 and the first build-up wiring layer 142 to each other.

The first build-up insulating layer 141 and the second build-up insulating layer 151 may respectively include an insulating material. The insulating material may include a thermosetting resin such as an epoxy resin, a thermoplastic resin such as polyimide, or a resin in which the thermosetting resin or the thermoplastic resin is impregnated in a material mixed with an inorganic filler such as silica, or a core material such as a glass fiber, together with the inorganic filler, for example, an insulating material such as an Ajinomoto build-up film (ABF), a prepreg, resin coated copper (RCC), photoimageable dielectric (PID), or the like, but the present disclosure is not limited thereto. The first build-up insulating layer 141 and the second build-up insulating layer 151 may include the same insulating material, but the present disclosure is not limited thereto, and the second build-up insulating layer 151 may include a material more advantageous for a wiring layer having a fine pitch than the first build-up insulation layer 141. A thickness of the second build-up insulating layer 151 may be less than a thickness of the first build-up insulating layer 141. The first build-up insulating layer 141 and the second build-up insulating layer 151 may respectively include a plurality of insulating layers.

The first build-up insulating layer 141 may include an insulating material different from that of the core layer 110. The core layer 110 may include an insulating material having excellent rigidity and a secured thickness, as a core material of the printed circuit board. Any insulating layer, usable as an insulating layer for lamination of the printed circuit board, may be used as the first build-up insulating layer 141 without limitation. In some cases, one of material groups of the core layer 110 may be selected as a material of the first build-up insulating layer 141, and one of material groups of the first build-up insulating layer 141 may be selected as a material of the core layer 110. However, even in this case, the core layer 110 and the first build-up insulating layer 141 may have different physical properties, such as a thickness of the first build-up insulating layer 141 being less than that of the core layer 110 or a rigidity of the core layer 110 being greater than that of the first build-up insulating layer 141, or the like. In addition, the core layer 110 may be distinguished from the first build-up insulating layer 141 in that a copper foil is laminated on the core layer 110 or panel plating is performed on the core layer 110. In the printed circuit board according to an example, the first wiring layer 120 having a fine pitch may be implemented on the core layer 110 even though a copper foil-laminated board used as the core layer 110, and the first build-up insulating layer 141 and the second build-up insulating layer 151, other than the core layer 110, may be distinguished from the core layer 110.

The first build-up wiring layer 142 and the second build-up wiring layer 152 may respectively include a metal. The metal may include copper (Cu), aluminum (Al), silver (Ag), tin (Sn), gold (Au), nickel (Ni), lead (Pb), titanium (Ti), or alloys thereof, and may preferably include copper (Cu), but the present disclosure is not limited thereto. The first build-up wiring layer 142 and the second build-up wiring layer 152 may respectively include an electroless plating layer (or chemical copper) and an electrolytic plating layer (or electrolytic copper), but the present disclosure is not limited thereto. A sputtering layer may be formed instead of the electroless plating layer, and both may be included. In addition, a copper foil may be further included. The first build-up wiring layer 142 and the second build-up wiring layer 152 may respectively perform various functions depending on a design of a corresponding layer. For example, a ground pattern, a power pattern, a signal pattern, and the like may be included. The above-described patterns may respectively include a line pattern, a plane pattern, and/or a pad pattern. The first build-up wiring layer 142 and the second build-up wiring layer 152 may respectively include a plurality of wiring layers. The second build-up wiring layer 152 may include a wiring finer than that of the first build-up wiring layer 142. For example, a thickness of the second build-up wiring layer 152 may be less than a thickness of the first build-up wiring layer 142, and may have a narrow pitch and a smaller line/space, such as a high wiring density. That is, the second build-up wiring layer 152 may be a redistribution layer for connection to a semiconductor chip.

The first build-up via layer 143 and the second build-up via layer 153 may respectively include a micro via. The micro via may be a filled via filling a via hole, or a conformal via disposed along a wall surface of the via hole. The micro via may be disposed as a stacked-type via and/or a staggered-type via. The first build-up via layer 143 and the second build-up via layer 153 may respectively include a metal, and the metal may include copper (Cu), aluminum (Al), silver (Ag), tin (Sn), gold (Au), nickel (Ni), lead (Pb), titanium (Ti), or alloys thereof, and may preferably include copper (Cu), but the present inventive concept is not limited thereto. The first build-up via layer 143 and the second build-up via layer 153 may respectively include an electroless plating layer (or chemical copper) and an electrolytic plating layer (or electrolytic copper), but the present disclosure is not limited thereto. A sputtering layer may be formed instead of the electroless plating layer, and both may be included. The first build-up via layer 143 and the second build-up via layer 153 may respectively perform various functions depending on a design of a corresponding layer. For example, a ground via, a power via, a signal via, and the like may be included. The first build-up via layer 143 and the second build-up via layer 153 may respectively include a plurality of via layers.

The printed circuit board according to an example may further include a solder resist layer 160 on an outermost side thereof. The solder resist layer 160 may be disposed on each of the first build-up insulating layer 141 and the second build-up insulating layer 151. The solder resist layer 160 may include an insulating material, and may be a liquid-type solder resist or a film-type solder resist, but the present disclosure is not limited thereto, and may include other types of insulating materials. The solder resist layer 160 may have an opening, exposing at least a portion of the first build-up wiring layer 142 and the second build-up wiring layer 152.

The printed circuit board according to an example may further include a surface treatment layer 170 disposed on the first build-up wiring layer 142 and the second build-up wiring layer 152, exposed by the opening of the solder resist layer 160. The surface treatment layer 170 may include one metal, among nickel (Ni), palladium (Pd), and gold (Au), and a plurality of layers including the above-described metal may be implemented. For example, the surface treatment layer 170 may be at least a portion of an electroless nickel electroless palladium immersion gold (ENEPIG) structure, or may be at least a portion of an electroless nickel immersion gold (ENIG) structure. The surface treatment layer 170 may include an organic solder passivation (OSP) structure including an organic material, but the present disclosure is not limited thereto.

In FIG. 3, it is illustrated that the second build-up insulating layer 151 and the second build-up wiring layer 152 are disposed on the first build-up insulating layer 141, but the present disclosure is not necessarily limited thereto, and the second build-up insulating layer 151 and the second build-up wiring layer 152 may be omitted in some cases.

In addition, the printed circuit board according to an example is not limited to the components illustrated in FIG. 3. Other components may be further included, or the illustrated components may be omitted in some cases. That is, the printed circuit board may further include a component that could be used by those skilled in the art.

Figure 4A:
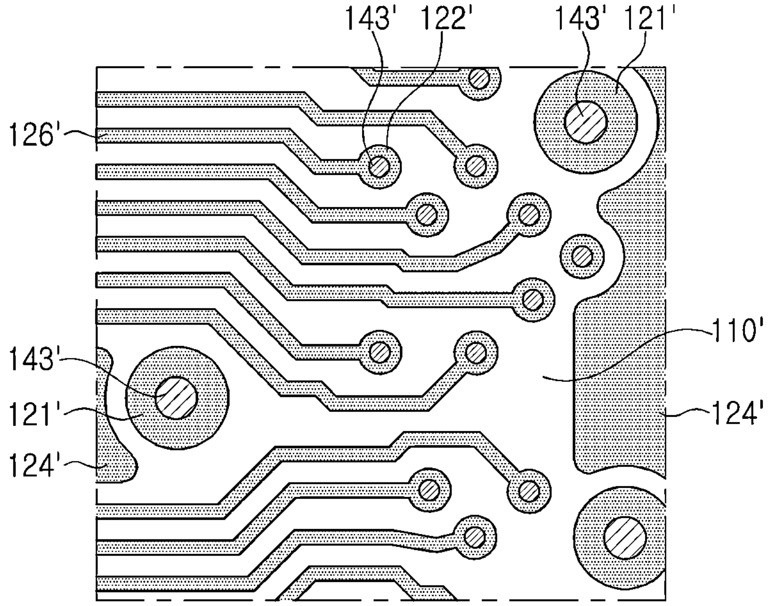
FIGS. 4A and 4B are a schematic design plan view and a schematic image plan view of a core layer of a printed circuit board according to the related art.
Figure 4B:
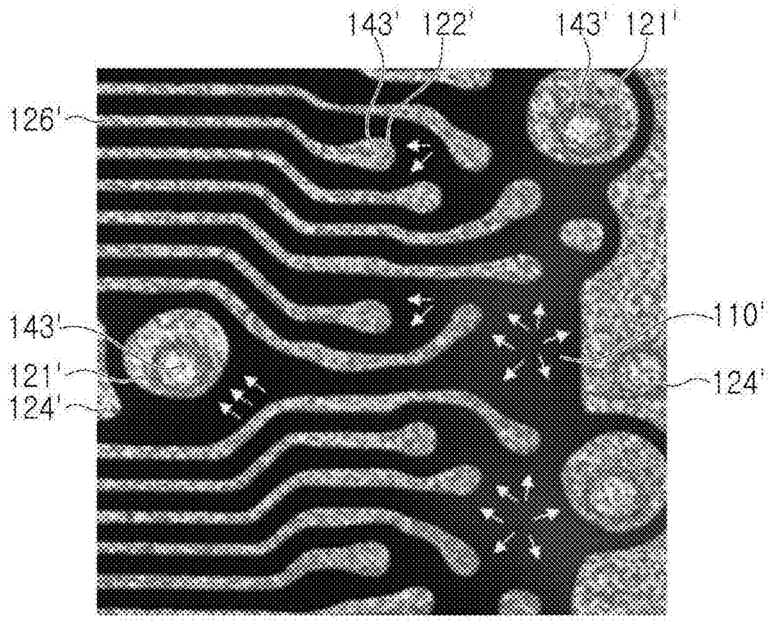

FIGS. 4A and 4B are a schematic design plan view and a schematic image plan view of a core layer of a printed circuit board according to the related art.

When chemical etching is used in an operation of forming a first wiring layer 126', it may not be easy to finely remove a portion of a copper foil widely formed on a core layer 110'. In particular, when a first wiring 126' having a fine line width is formed, a defect may occur in which the first wiring 126' is broken in the middle and opened, and adjacent first wirings 126' may not be completely separated from each other, resulting in a defect in which a short circuit occurs. It may be difficult to implement a wiring layer having a fine line width using such a method of removing a portion of a copper foil.

In addition, difficulties may arise in implementing a first pad 121' and a second pad 122' having a fine width and pitch. In particular, in the case of a pad, a wiring may not be formed around the pad, such that an etchant may be concentrated around the first pad 121' and the second pad 122'. Accordingly, the first pad 121' and the second pad 122' may have a shape, different from that designed in FIG. 4A, as illustrated in FIG. 4B. That is, larger portions of the first pad 121' and second pad 122' may be removed from regions of the first pad 121' and second pad 122', not adjacent to the first wiring 126', than those in the design, such that the first pad 121' and the second pad 122' may have a reduced area. However, the present disclosure is not limited thereto, and the etchant may not evenly permeate in regions of the first pad 121' and the second pad 122', adjacent to the first wiring 126'. In this case, the first pad 121' and the second pad 122' may not be separated from an adjacent first wiring 126', resulting in a defect due to a short circuit.

That is, when the etchant is introduced for patterning, it may not be easy to remove the first pad 121' and the second pad 122' from the regions of the first pad 121' and the second pad 122', adjacent to the first wiring 126'. Conversely, in the regions of the first pad 121' and the second pad 122', not adjacent to the first wiring 126', over-etching of the first pad 121' and the second pad 122' may occur. The first pad 121' and the second pad 122' may have a shape and position different from those in the design. Accordingly, when a first build-up via layer 143 is formed on the first pad 121' and the second pad 122', a misalignment defect may occur, and interlayer connection may not be smoothly performed.

Figure 5A:
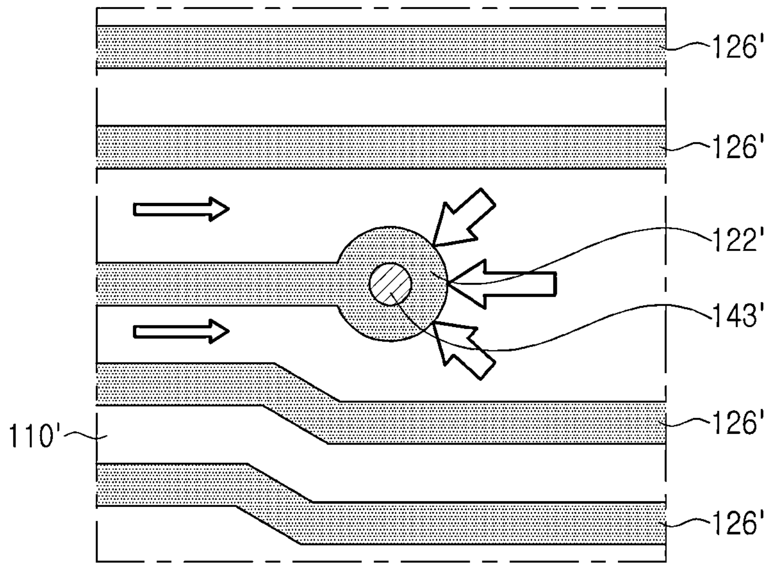
FIGS. 5A, 6A, and 7A are schematic plan views of a portion of a design of a core layer of a printed circuit board according to the related art.
Figure 6A:
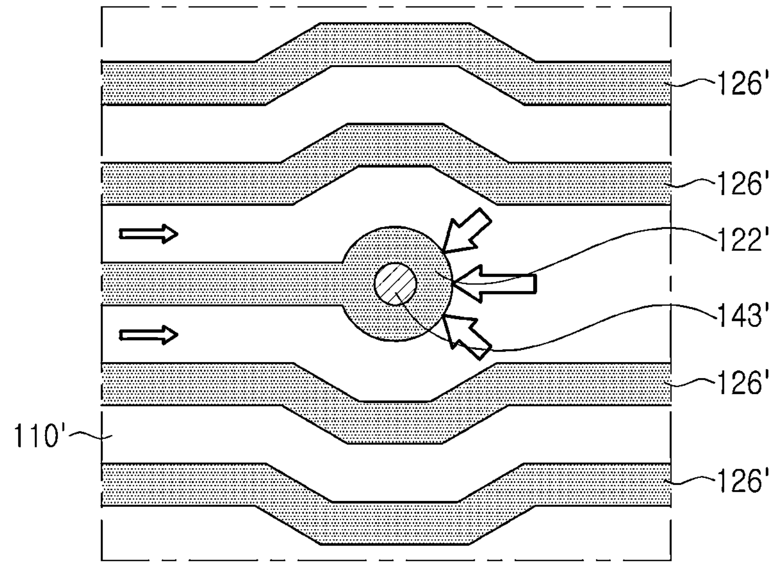
Figure 7A:
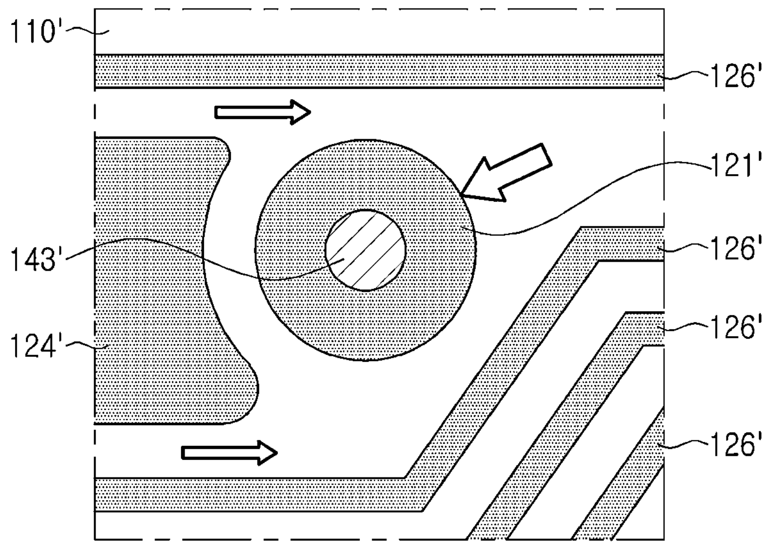

FIGS. 5A, 6A, and 7A are schematic plan views of a portion of a design of a core layer of a printed circuit board according to the related art.

Referring to FIGS. 5A and 6A, a region of the second pad 122', connected to a wiring, may be different from a region of the second pad 122', not connected to the wiring, in terms of an amount of flowing etchant. That is, referring to the region of the second pad 122', connected to the wiring, the etchant may be restricted by the wiring connected to the second pad 122', and may permeate toward the second pad 122'. Conversely, referring to an opposite side of the region of the second pad 122', connected to the wiring, the second pad 122' may have an open region, such that the etchant may be concentrated in the open region of the second pad 122'. Accordingly, the above-described defects may occur.

Referring to FIG. 7A, the first pad 121' may be adjacent to the first wiring 126' and a first pattern 124'. In this case, the etchant may not move smoothly due to the first wiring 126' and the first pad 121'. Conversely, in a region of the first pad 121', not adjacent to the first wiring 126' and the first pattern 124', the etchant may be concentrated. Accordingly, even in this case, the above-described defects may occur.

Figure 5B:
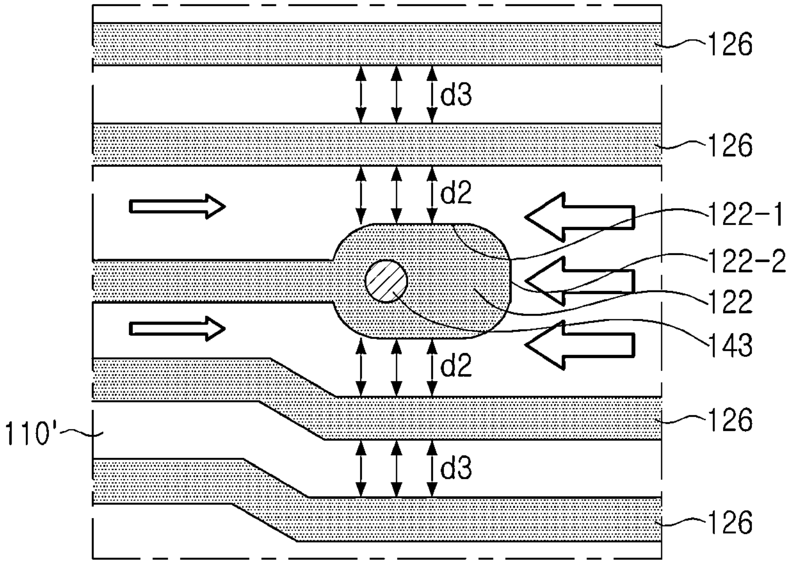
FIGS. 5B, 6B, and 7B are schematic plan views of a portion of a design of a core layer of a printed circuit board according to an example.
Figure 5B:
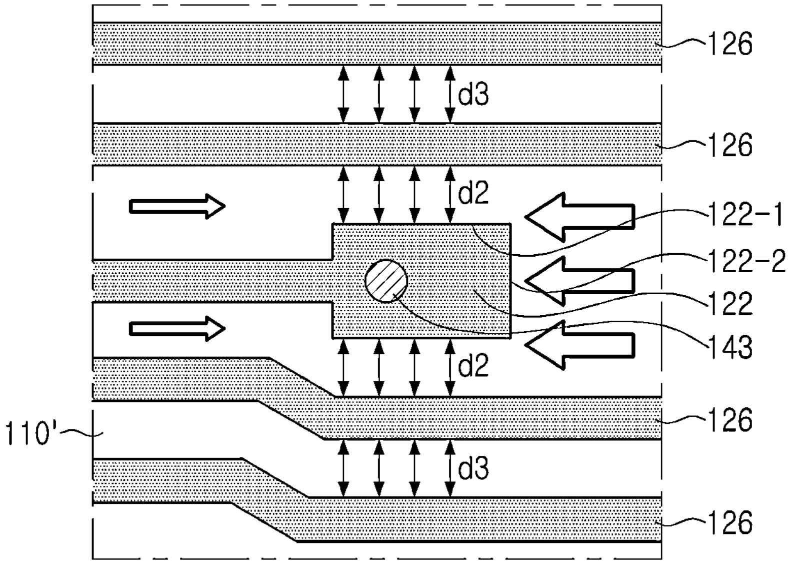
Figure 6B:
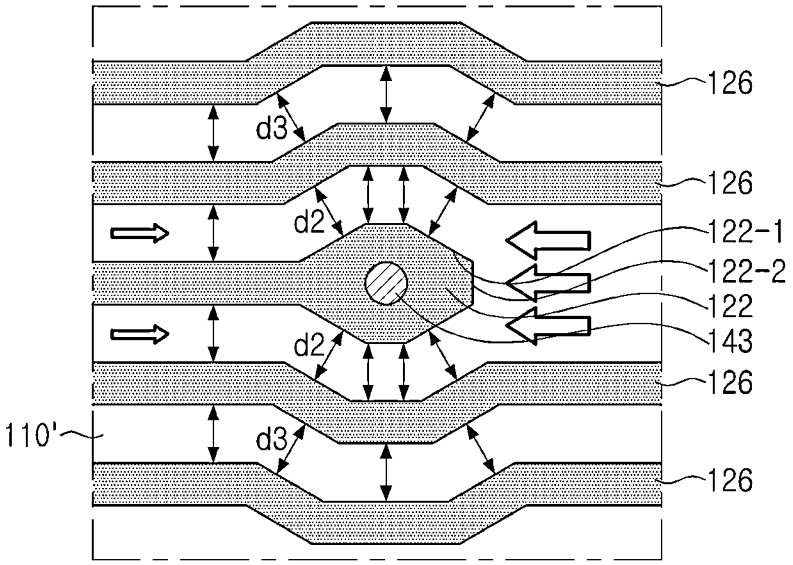
Figure 7B:
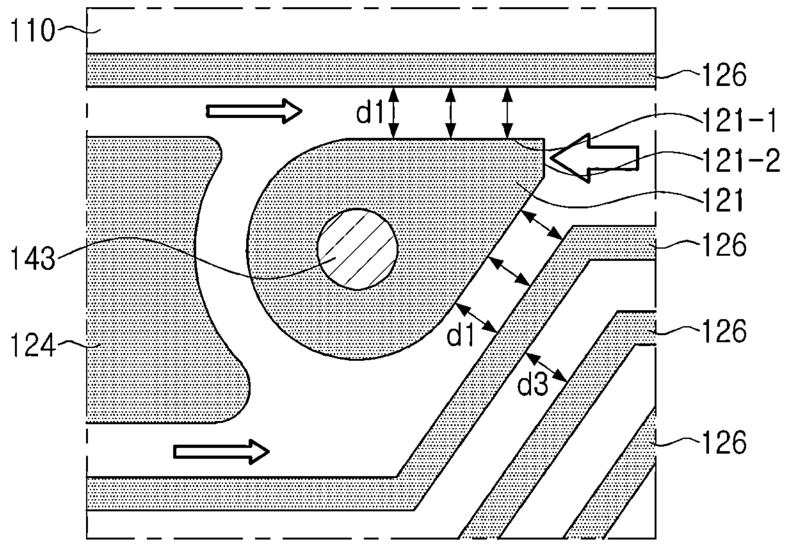

FIGS. 5B, 6B, and 7B are schematic plan views of a portion of a design of a core layer of a printed circuit board according to an example.

Referring to FIGS. 5B and 6B, a second pad 122 may include an adjacent portion 122-1, a region of the second pad 122 adjacent to a first wiring 126, and an open portion 122-2, a region of the second pad 122, not adjacent to the first wiring 126 and not connected to other wirings.

The adjacent portion 122-1 of the second pad 122 may include a portion substantially parallel to the first wiring 126 to which the second pad 122 is adjacent. The adjacent portion 122-1 of the second pad 122 being substantially parallel to the first wiring 126 may mean that the adjacent portion 122-1 of the second pad 122 has an edge parallel to a wiring path of the first wiring 126, a linear pattern. The present disclosure is not limited thereto, and being substantially parallel may be based on a rough concept, for example, a concept including errors that may be included in a manufacturing operation or a measurement method.

The open portion 122-2 of the second pad 122 may mean a region of the second pad 122, not adjacent to the first wiring 126. The open portion 122-2 of the second pad 122 may mean a region of the second pad 122, not parallel to the first wiring 126, and may mean that a virtual extension line in the open portion 122-2 of the second pad 122 may be in contact with an adjacent first wiring 126. The opening 122-2 of the second pad 122 may be positioned on an opposite side of a region of the second pad 122 that is connected to a wiring. The opening 122-2 of the second pad 122 may be positioned to be far from a region in which a first build-up via layer 143 is positioned. That is, the opening portion 122-2 of the second pad 122 may be designed to have an area larger than that required for the second pad 122 to be connected to the first build-up via layer 143.

When an etchant flows along the first wiring 126, the printed circuit board according to an example may prevent the etchant from being concentrated on the second pad 122 due to the second pad 122 including the adjacent portion 122-1 and the open portion 122-2. In particular, the adjacent portion 122-1 may be substantially parallel to the first wiring 126, thereby preventing the etchant from being concentrated on the second pad 122, unlike when the second pad 122 has a circular shape. In addition, as the second pad 122 has the adjacent portion 122-1, the open portion 122-2 may be positioned in a region away from a wiring connected to the second pad 122. That is, in the printed circuit board according to an example, the second pad 122 may not be symmetrical with respect to the first build-up via layer 143. That is, as the second pad 122 has the adjacent portion 122-1 and the open portion 122-2, defects may be prevented from occurring in the second pad 122 in an operation in which the etchant permeates to form the second pad 122.

A distance d2 between the adjacent portion 122-1 of the second pad 122 and the first wiring 126, adjacent to the second pad 122, may be substantially equal to a distance d3 between adjacent first wirings 126. A distance between the adjacent portion 122-1 of the second pad 122 and the first wiring 126 may be measured by photographing a cut plane or cross-section of the printed circuit board using a scanning microscope. A distance between certain components may be an average of values obtained by performing measurement at five arbitrary points, but the present disclosure is not necessarily limited thereto. The adjacent portion 122-1 of the second pad 122 may be substantially parallel to the adjacent first wiring 126, such that the distance d2 between the adjacent portion 122-1 of the second pad 122 and the first wiring 126 may mean a distance between the adjacent portion 122-1 of the second pad 122 and the first wiring 126. In the same sense, the distance between the adjacent first wirings 126 may mean a distance between the adjacent first wirings 126. The distance d2 between the adjacent portion 122-1 of the second pad 122 and the first wiring 126 and the distance d3 between the adjacent first wiring 126 may be measured on substantially the same plane. That is, the distance between adjacent first wirings 126 may be measured as an extension line of a virtual line for measuring the distance between the adjacent portion 122-1 of the second pad 122 and the first wiring 126.

Referring to FIG. 7B, a first pad 121 may include an adjacent portion 121-1, a region of the first pad 121, adjacent to the first wiring 126, and an open portion 121-2, a region of the first pad 121, not adjacent to the first wiring 126 and not connected to other wirings. In addition, the first pad 121 may be adjacent to a first pattern 124 having a planar shape.

A distance d1 between the adjacent portion 121-1 of the first pad 121 and the first wiring 126 may be substantially equal to the distance d3 between the adjacent first wirings 126. In addition, a distance between the first pattern 124 and the first pad 121 may also be substantially equal to the distance d1 between the adjacent portion 121-1 of the first pad 121 and the first wiring 126.

As the first pad 121 has the adjacent portion 121-1 and the open portion 121-2, the printed circuit board according to an example may prevent occurrence of a defect in which an etchant is concentrated on the first pad 121, and accordingly the first pad 12 is excessively etched, and the first pad 121 may also have a shape that is not symmetrical with respect to a position in which the first build-up via layer 143 is formed.

FIGS. 5B, 6B, and 7B illustrate only a portion of a core layer 110 of a printed circuit board according to an example, and arrangements and shapes of the first pad 121, the second pad 122, and the first pattern 124 are not limited thereto. The first pad 121 and the second pad 122 may be connected to the first build-up via layer 143, and the first pad 121 and the second pad 122 may respectively include the adjacent portions 121-1 and 122-1, regions of the first pad 121 and the second pad 122, substantially parallel to the adjacent first wiring 126, and the open portions 121-2 and 122-2, regions of the first pad 121 and the second pad 122, not adjacent to the first wiring 126. Accordingly, when an etchant is concentrated on the first pad 121 and the second pad 122, an area of a pad on which the first build-up via layer 143 is to be formed may be secured, thereby implementing the first wiring layer 120 including a fine pattern on the core layer 110 at low cost.

Figure 8:
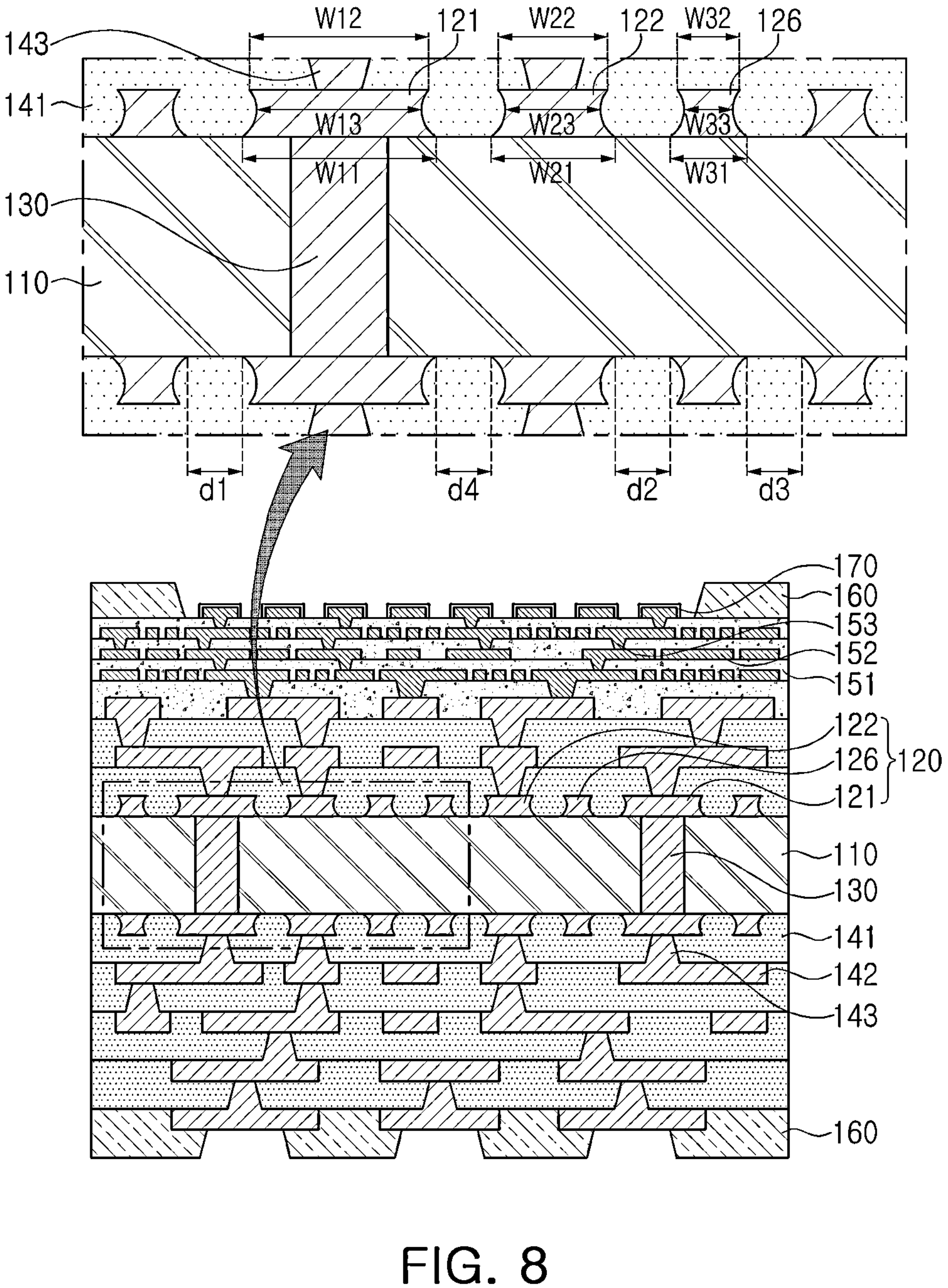
FIG. 8 is a schematic cross-sectional view of a printed circuit board according to another example.

FIG. 8 is a schematic cross-sectional view of a printed circuit board according to another example.

Referring to FIG. 8, side surfaces of a first pad 121, a second pad 122, and a first wiring 126 of a printed circuit board according to another example may be curved surfaces. Such a configuration may be a result of forming a first wiring layer on a core layer 110 using one of a subtractive method or tenting method, but the present disclosure is not limited thereto.

A width W11 of a lower surface of the first pad 121 may be greater than or equal to a width W12 of an upper surface of the first pad 121, and a width W13 of a central portion of the first pad 121 may be less than the width W12 of the upper surface. That is, the first pad 121 may satisfy a relationship W11≥W12>W13. Such a configuration may be a result of adjusting a degree of permeation of an etchant in an operation of removing an unnecessary portion by disposing an etching mask and then injecting the etchant to form the first pad 121. A shape of a pad may be adjusted using an etching additive in the etchant, and the width W12 of the upper surface may be formed to be greater than the width W13 of the central portion, such that it may be more advantageous for alignment when the first build-up via layer 143 is disposed on the first pad 121.

In the same sense, a width W21 of a lower surface of the second pad 122 may also be greater than or equal to a width W22 of an upper surface of the second pad 122, and a width W23 of a central portion of the second pad 122 may be less than the width W22 of the upper surface. That is, the second pad may satisfy a relationship W21≥W22>W23. Accordingly, it may also be advantageous for alignment when the first build-up via layer 143 is disposed on the second pad 122.

The first wiring 126 may be formed simultaneously when the first pad 121 and the second pad 122 are patterned, such that a width W31 of a lower surface of the first wiring 126 may also be greater or equal to a width W32 of an upper surface of the first wiring 126, and a width W33 of a central portion of the first wiring 126 may be less than the width W32 of the upper surface. That is, the first wiring 126 may also satisfy a relationship W31≥W32>W33.

A first build-up wiring layer 142 and a second build-up wiring layer 152 may be manufactured using a method different from that of a first wiring layer 120, such that the first build-up wiring layer 142 and the second build-up wiring layer 152 may not have a side surface shape the same as that of the first wiring layer 120. However, the present disclosure is not necessarily limited thereto. When a method of forming the first wiring layer 120 is used to form the first build-up wiring layer 142 and/or the second build-up wiring layer 152, the first build-up wiring layer 142 and/or the second build-up wiring layer 152 may also have a shape the same as that of the first wiring layer 120.

A configuration of the printed circuit board according to an example, excluding the shape of the side surface of the first wiring layer 120, such as the first pad 121, the second pad 122, and the first wiring 126, may be applied to the printed circuit board according to another example, and thus a repeated description related thereto will be omitted.

As used herein, a cross-sectional shape may refer to a cross-sectional shape of an object when the object is vertically cut, or a cross-sectional shape of the object when the object is viewed in a side-view. In addition, a shape on a plane may be a shape of the object when the object is horizontally cut, or a planar shape of the object when the object is viewed in a top-view or a bottom-view.

As used herein, an upper side, an upper portion, the upper surface, or the like is used to refer to a direction toward a surface on which an electronic component is mountable based on a cross-section of a drawing for ease, and a lower side, a lower portion, a lower surface, or the like is used to refer to an opposite direction thereof. However, the above-described directions are defined for ease of description.

Thus, it should be understood that the scope of the claims is not particularly limited by the above-described directions.

As used herein, the term "connected" may not only refer to being "directly connected" but also include "indirectly connected" by means of an adhesive layer, or the like. The term "electrically connected" may include both of a case in which components are "physically connected" and a case in which components are "not physically connected." In addition, the terms "first," "second," and the like may be used to distinguish a component from another component, and may not limit a sequence and/or an importance, or others, in relation to the components. In some cases, a first component may be referred to as a second component, and similarly, a second component may be referred to as a first component without departing from the scope of the example embodiments.

As used herein, a process error or a positional deviation occurring in a manufacturing process, an error in measurement, and the like may be included. For example, "substantially perpendicular" may include not only be "completely perpendicular," but may also be "approximately perpendicular." In addition, "substantially coplanar" may include not only being "completely coplanar," but also "approximately coplanar."

As used herein, the same insulating material may mean not only the exact same insulating material, but also the same type of insulating material. Thus, compositions of insulating materials may be substantially the same, but specific composition ratios thereof may slightly vary.

As used herein, the term "an example embodiment" is provided to emphasize a particular feature, structure, or characteristic, and do not necessarily refer to the same example embodiment. In addition, the particular characteristics or features may be combined in any suitable manner in one or more example embodiments. For example, a context described in a specific example embodiment may be used in other example embodiments, even if it is not described in the other example embodiments, unless it is described contrary to or as being inconsistent with the context in the other example embodiments.

The terms used herein describe particular example embodiments only, and the present disclosure is not limited thereby. As used herein, singular forms "a," "an," and "the" are intended to include the plural forms as well, unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A printed circuit board comprising:

a core layer;

a plurality of first wirings disposed on the core layer;

a first pad disposed on the core layer, the first pad including an adjacent portion having a side disposed to be substantially parallel to a side of an adjacent first wiring of the plurality of first wirings, and an open portion disposed to not be parallel to the adjacent wiring, among the plurality of first wirings; and a first build-up insulating layer disposed on the core layer, the first build-up insulating layer covering at least a portion of the plurality of first wirings and the first pad, wherein the core layer includes an insulating material, substantially different from that of the first build-up insulating layer.

2. The printed circuit board of claim 1, wherein the first wiring and the first pad are disposed on each of upper and lower surfaces of the core layer.

3. The printed circuit board of claim 2, wherein the first wiring and the first pad protrude from each of the upper and lower surfaces of the core layer, and are embedded by the first build-up insulating layer.

4. The printed circuit board of claim 1, further comprising:

a second pad disposed on the core layer, the second pad including an adjacent portion having a side disposed to be substantially parallel to a side of an adjacent first wiring of the plurality of first wirings, and an open portion disposed to not be parallel to the adjacent wiring, among the plurality of first wirings; and a through-via connected to the second pad, the through-via passing through the core layer.

5. The printed circuit board of claim 4, wherein a width of the first pad is less than a width of the second pad, and a line width of the plurality of first wirings is less than the width of the first pad.

6. The printed circuit board of claim 4, wherein each of the first pad and the second pad has an upper surface having a width less than or equal to a width of a lower surface thereof, and has a central portion having a width less than the width of the upper surface.

7. The printed circuit board of claim 6, wherein at least one first wiring, among the plurality of first wirings, has an upper surface having a width less than or equal to a width of a lower surface thereof, and has a central portion having a width less than the width of the upper surface.

8. The printed circuit board of claim 4, wherein a distance between the adjacent portion of the first pad and the adjacent first wiring adjacent to the first pad is substantially equal to a distance between the adjacent first wiring adjacent to the first pad and first wirings adjacent the adjacent first wiring, and a distance between the adjacent portion of the second pad and the adjacent first wiring adjacent to the second pad is substantially equal to the distance between the adjacent first wiring adjacent to the second pad and first wirings adjacent to the adjacent first wiring.

9. The printed circuit board of claim 1, further comprising:

a first build-up wiring layer disposed on the first build-up insulating layer; and a first build-up via layer passing through at least a portion of the first build-up insulating layer to connect the first build-up wiring layer and the first pad to each other.

10. The printed circuit board of claim 9, further comprising:

a second build-up insulating layer disposed on the first build-up insulating layer;

a second build-up wiring layer disposed on the second build-up insulating layer; and a second build-up via layer passing through at least a portion of the first build-up insulating layer to connect the second build-up wiring layer and the first build-up wiring layer to each other.

11. The printed circuit board of claim 1, further comprising:

a second wiring connected to the first pad, wherein the open portion of the first pad is disposed on an opposite side of a region of the first pad, connected to the second wiring.

12. The printed circuit board of claim 11, further comprising:

a first build-up via connected to the first pad, wherein the first build-up via is disposed to be closer to the second wiring than to the open portion of the first pad.

13. A printed circuit board comprising:

a first insulating layer;

a plurality of first wirings respectively disposed on upper and lower surfaces of the first insulating layer; and a first pad disposed on each of the upper and lower surfaces of the first insulating layer, the first pad including an adjacent portion having a side disposed to be substantially parallel to a side of an adjacent first wiring of the plurality of first wirings, and an open portion disposed to not be parallel to the adjacent first wiring, wherein a distance between the adjacent portion of the first pad and the adjacent first wiring adjacent to the first pad is substantially equal to a distance between the adjacent first wiring adjacent to the first wiring and first wirings adjacent the adjacent first wiring.

14. The printed circuit board of claim 13, further comprising:

a second insulating layer disposed on each of the upper and lower surfaces of the first insulating layer, the second insulating layer covering at least a portion of the plurality of first wirings and the first pad; and a first via passing through at least a portion of the second insulating layer, the first via connected to the first pad.

15. The printed circuit board of claim 14, further comprising:

a second wiring connected to the first pad, wherein the open portion of the first pad is disposed on an opposite side of a region of the first pad, connected to the second wiring.

16. The printed circuit board of claim 15, further comprising:

a first build-up via connected to the first pad, wherein the first build-up via is disposed to be closer to the second wiring than to the open portion of the first pad.

17. The printed circuit board of claim 13, further comprising:

a first pattern disposed on the first insulating layer, the first pattern having a planar shape, wherein a distance between the first pattern and the first pad is substantially equal to a distance between the adjacent portion of the first pad and the wiring adjacent to the first pad, among the plurality of first wirings.

18. A printed circuit board comprising:

a core layer;

first wirings disposed on the core layer;

a first pad disposed on the core layer, the first pad having an oblong shape such that:

a pair of first sides of the first pad are substantially parallel to sides of adjacent first wirings adjacent to the first pad, and a second side of the first pad, extending from and connecting the pair of first sides, is not parallel to the sides of the adjacent first wirings, wherein a distance between first wirings is substantially same as distance between the first sides and the adjacent first wirings.

19. The printed circuit board of claim 18, wherein the first pad has a third side opposite the second side, the third side being directly connected to a second wiring disposed on the core layer, the second wiring extending substantially parallel to the first sides.

20. The printed circuit board of claim 18, further comprising a via connected to the first pad and disposed away from the second side relative to a center of the first pad.

21. The printed circuit board of claim 18, further comprising a through-via penetrating the core layer and connected to the first pad.

* * * * *